May 24, 1960 W. J. POPOWSKY 2,938,173

MEASURING CIRCUIT USING MODULATED TRANSISTOR OSCILLATOR WITH TEMPERATURE STABILIZATION

Filed May 16, 1955

INVENTOR.

WILLIAM J. POPOWSKY

BY [signature]

ATTORNEY.

United States Patent Office 2,938,173

Patented May 24, 1960

2,938,173

MEASURING CIRCUIT USING MODULATED TRANSISTOR OSCILLATOR WITH TEMPERATURE STABILIZATION

William J. Popowsky, Philadelphia, Pa., assignor to Minneapolis-Honeywell Regulator Company, Minneapolis, Minn., a corporation of Delaware Filed May 16, 1955, Ser. No. 508,705

8 Claims. (Cl. 332—31)

A general object of the present invention is to provide a new and improved stabilized transistor oscillator circuit utilized in a signal transducer. More specifically, the present invention is concerned with an improved type of electrical signal transducer incorporating a transistor oscillator circuit which is stabilized for operation over a wide range of ambient temperature change.

In a copending application of the present inventor entitled "Electrical Control Apparatus," bearing Serial No. 442,264, and filed July 9, 1954, now Patent 2,847,625 issued August 12, 1958, there is disclosed a transistor transducer circuit incorporating an electrical oscillator whose output current is adapted to vary proportionally and substantially linearly with changes in the magnitude of an input impedance. The present invention is concerned with the improvement of the temperature stability of apparatus of the type disclosed in the aforementioned application.

In the present type of oscillator as disclosed in the above application, difficulty is encountered in initiating oscillation in the circuit under low ambient temperature conditions. This may be overcome by the addition of an electrical biasing circuit which will vary with ambient temperature and maintain the gain of the transistor and its impedances in a range in which oscillations may be initiated even under low temperature conditions.

An additional problem arises in apparatus of the type disclosed in the above mentioned application under conditions of low output current operation and high output current operation. The problems in the low and high output current ranges of operation arise due to the provision of the temperature stabilizing bias circuits which are arranged to cause current to flow through the transistor of the oscillator circuit. In order to limit the amount of current that will flow under low current conditions, it is desirable to provide an emitter bias signal which will be effective under low current conditions to bias the transistor circuit in a direction of low conductivity. When it is desired that the output current of the transistor circuit be high, it is necessary that this bias circuit be ineffective to limit the maxmum current that can be drawn from the transistor. This has been achieved in the present circuit by the provision of a non-linear biasing circuit which has an impedance variable in accordance with the amplitude of the current flowing through the transistor device.

It is accordingly a more specific object of the present invention to provide a new and improved transistor oscillator circuit which will produce a limiting action on the transistor output circuit under conditions of low current conductivity and is operative to prevent the application of an effective degenerative bias to the transducer under conditions of high current conductivity.

Still another object of the present invention is to provide an improved temperature stable transistor-transducer oscillator circuit whose output varies linearly with the variations in impedance of a reactive element in the input of the transistor in combination with a non-linear biasing means for improving the operation of the circuit in its extreme ranges of operation.

A further object of the present invention is to provide an improved transistor oscillator circuit which incorporates a transistor having an output circuit with biasing means which produces a non-linear biasing voltage to the transistor in accordance with the magnitude of the output current of the transistor.

In another form of the present invention, the electrical impedance used to vary the conductivity of the circuit is a capacitive reactance whose capacity is varied in accordance with the magnitude of a direct current potential applied across the plates of the condenser.

It is therefore a still further object of the invention to provide an improved electrical transistor oscillator circuit for producing proportional output current variations which vary in accordance with the magnitude of a direct current signal applied to a direct current potential sensitive capacitive reactance.

In still another form of the present apparatus, an improved highly sensitive inductance element has been provided in the form of a variable inductance which is immersed in a chamber containing an electrolyte. This form of the apparatus also provides a stabilizing effect due to the damping action of the electrolyte as well as an improved temperature compensation effect due to shift in the conductivity characteristics of the electrolyte.

Another object is, therefore, to provide an improved transistor transducer incorporating a variable inductance which is immersed in an electrolyte.

The various features of novelty which characterize the invention are pointed out with particularity in the claims annexed hereto and forming a part of this specification. For a better understanding of the invention, its advantages, and specific objects attained with its use, reference should be had to the accompanying drawings and descriptive matter in which there is illustrated and described preferred embodiments of the invention.

Figure 1:
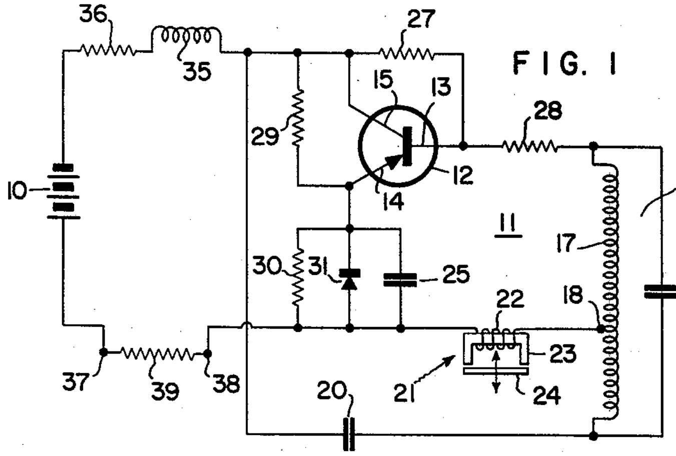
Fig. 1 is a schematic showing of the principles of the present invention applied to a motion to current transducer.

*Figure 1*

Referring to Fig. 1, the numeral 10 represents a direct current power source in the form of a battery. This power source is arranged to supply the operating power for a transistor oscillator circuit 11. This transistor oscillator circuit 11 comprises a transistor 12 having a base electrode 13, an emitter electrode 14, and a collector electrode 15.

The alternating current portion of the oscillator circuit 11 comprises, in addition to the transistor 12, a resonant circuit 16 which includes a tapped inductance element 17, tapped at 18 and a condenser 19. A feedback coupling condenser 20 serves to couple the output of the transistor 12 to the resonant circuit 16. For adjusting the level of the circuit oscillation, there is provided a variable impedance 21 in the form of a coil 22 mounted upon a core 23. The air gap of the core 23 is arranged to be variably changed by a movable core member 24. A bypass condenser 25 is connected in the emitter circuit of the transistor 12.

The direct current biasing elements of the present circuit include a resistor 27 which is connected in shunt between the collector 15 and base 13. In series with the resistor 27 is a negative temperature coefficient resistor 28. Connected in shunt between the collector 15 and the emitter 14 is a further negative temperature coefficient resistor 29. Connected to the emitter electrode 14 is a resistor 30 and a diode 31, the latter being connected in parallel with the resistor 30.

The power supply to the transistor oscillator circuit 11 includes, in addition to the battery 10, a choke coil 35, a resistor 36, and a pair of output terminals 37 and 38, the latter of which are arranged to have a suitable indicator and/or controller connected thereto with the input of such an output device having an impedance as represented by the resistor 39. It will be readily apparent that the apparatus may be used in any indicating or control function in the manner well known in the art.

In considering the operation of the present apparatus, it should first be noted that the apparatus is intended to produce an output current flowing in the output terminals 37 and 38 which varies proportionally with the position of the core member 24 with respect to the core 23. Thus, as the core 24 is moved closer to the core 23, it is intended that the output current flowing through the load impedance 39 will decrease while if the core 24 is moved away from the core 23, it is intended that the current through the load impedance 39 increase.

The direct current supply circuit for the transistor 12 may be traced from the lower terminal of the battery 10 through load impedance 39, resistor 30 and diode 31, connected in parallel, emitter 14, collector 15, choke coil 35, and resistor 36 back to the upper terminal of the battery 10. The average direct current flowing in this last traced circuit will be directly dependent upon the intensity of the oscillations of the transistor oscillator circuit 11.

The output alternating current circuit of the transistor 12 may be traced from the collector 15 through condenser 20, the lower portion of the inductance element 17 to tap 18, variable impedance 21 and condenser 25 back to the emitter 14 of the transistor 12. The regenerative feedback for the circuit is produced by the signal induced in the upper portion of the inductance element 17 and is coupled from the upper terminal of the inductance element 17 through resistor 28 to the base electrode 13. The amount of feedback in the upper portion of the inductance element 17 is dependent directly upon the magnitude of the impedance 21 and the amount of signal induced in the lower portion of the inductance element 17. As the magnitude of the impedance 21 goes down due to the movement of the core 24 away from the core 23, the intensity of the oscillations will increase due to a larger signal being fed back to the base electrode 13.

As the input impedance of transistor 12 increases with decreases in ambient temperature, it is essential that some means be provided that the input impedance and the gain not change to a value which will prevent the circuit from going into oscillation. This has been provided by the presence of the resistors 27 and 28.

As the internal impedances of the transistor increase with a decrease in ambient temperature, there is a resultant decrease in the current flow through the transistor between the electrodes thereof. Thus, under low ambient temperature conditions, the current flow between the emitter 14 and base 12 decreases to the point that the circuit is difficult to excite into a state of oscillation. The current flow in the emitter-base circuit may be increased by placing the resistor 27 between the base 13 and the negative terminal of the source 10. As the resistors 27 and 28 form a voltage divider across the source 10, the actual current flow will be a function of the relative magnitudes of the resistors 27 and 28 as well as the emitter-base impedance. Maximum emitter-base bias current will flow when resistor 28 is infinite in magnitude. Minimum emitter-base bias current will flow when resistor 28 is of zero magnitude. As there must be a certain magnitude of current flowing in the emitter-base circuit to initiate oscillations, and since the impedance of the transistor emitter-base circuit varies with temperature, it is necessary to vary the voltage on the base relative to the emitter 14 as the ambient temperature changes. As the temperature goes up, the resistance of the resistor 28 will go down so that the amount of bias on the emitter-base circuit will be decreased. This arrangement is desirable in that under high temperature conditions substantially no bias is required between the base 13 and emitter 14 to effect the desired current flow for oscillation initiating purposes.

Further temperature stabilization in the present circuit is achieved by the presence of the negative temperature coefficient resistor 29 which is connected between the collector 15 and the emitter 14. This is particularly effective in the high ambient temperature regions where the resistor 29 cooperates with resistors 30 and diode 31 to readjust the bias on the transistor 12 into a stable operating region.

Further temperature stabilization is achieved in the oscillator circuit by the resistor 30 and the diode 31. Under low current conditions, the impedance of the diode 31 is relatively high so that the net impedance of the diode in combination with the resistor 30 approaches that of the resistor 30. As the current in the circuit goes up, the impedance of the diode 31 goes down. By having a high impedance under low current conditions, it is possible to better limit the amount of leakage current that will be flowing in the emitter and collector path. Under high current conditions, it is desirable that this biasing circuit not limit the maximum current which will flow in the circuit and this is achieved by the diode 31 which appears as a relatively low resistance under high current conditions.

The biasing circuit elements which were found to work satisfactorily in one form of the apparatus in combination with a Honeywell H–2 transistor are as follows:

| | |
|---|---|
| Resistor 27 | 82K ohms. |
| Resistor 28 | 100 ohms. at 25° C. |
| Resistor 29 | 170K at 25° C. |
| Resistor 30 | 180 ohms. |
| Diode 31 | Type 1N91. |

It will be noted that in considering the above values that resistors 27 and 28 are selected to be of such a magnitude, while resistor 28 may change over a wide range of values with ambient temperature change, that the current flowing in the circuit formed by the resistors 28 and 27 connected in series will remain substantially unchanged since resistor 27 is large compared to the size of the resistor 28. This will mean that there will be a negligible change in the output direct current flowing through the load impedance 39.

From the foregoing it will be readily apparent that there has been disclosed a new and improved transistor oscillator circuit with improved temperature stability characteristics. Further, these stabilized characteristics have been incorporated in a transducer which is adapted to produce a proportional output current flow change which varies in accordance with an impedance change on the input of the oscillator circuit.

Figure 2:
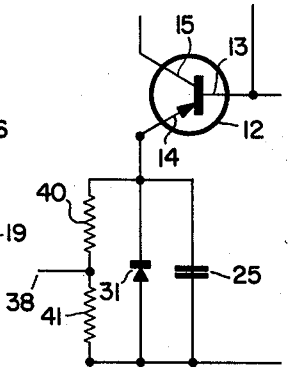
Fig. 2 shows a modification of the transistor biasing circuit details of the circuit of Fig. 1.

*Figure 2*

The modification shown in Fig. 2 is concerned with the biasing circuit for the emitter electrode of the transistor 12. The biasing circuit in this configuration is modified only to the extent that the resistance portion thereof has been divided into two resistors 40 and 41. The resistor 41 is selected to be of a negative temperature coefficient type so that ambient temperature changes will produce a change in the bias applied between the emitter 14 and the base 13. The resistor 41 may be used in lieu of the resistor 28 shown in Fig. 1 in that it is in the series circuit between the emitter 14 and the base 13.

In normal operation, the resistor 41 will produce the necessary bias voltage between the emitter 14 and the base 13 due to the current flowing in the input circuit due to the bypass resistor 27. In addition, the current flow to the emitter 14 in the normal output circuit configuration will be through resistor 40 to the emitter and through resistor 41 and diode 31 to the emitter. The principal distinction in the operation of Fig. 2 over that of Fig. 1 lies in the bypassing action of the condenser 25. This condenser bypasses the resistors 40 and 41 so that from the A.C. signal standpoint, the base biasing resistor 41 will not affect the A.C. signal feedback. Insofar as the D.C. bias is concerned, the operation of Fig. 2 is substantially the same as Fig. 1.

Figure 2A:
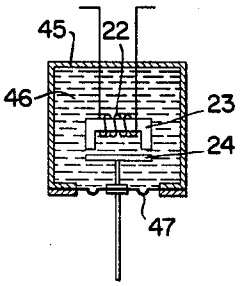
Fig. 2A shows a further modification of the motion detector.

*Figure 2A*

The motion sensing element 21 of Fig. 1 is shown in Fig. 2A enclosed in a chamber 45 which is filled with an electrolyte 46. Motion is transmitted into the chamber 46 by way of a rod 47 which extends through a suitable flexible seal 48.

The placing of this inductance element 21 in the electrolyte is to increase the sensitivity of the device to any motion change. The electrolyte serves to vary the resistance in the circuit to eddy currents present in the air gap. As the cores separate, there is a decrease in the resistance to the eddy currents and this will appear as a decrease in the inductance of coil 22. This factor will be in an additive relation with the inductance change due to the movement of the cores, as in Fig. 1 to thus increase the net inductance change. The electrolyte further serves as an effective damping medium.

A further advantage of this arrangement lies in its temperature compensating effects. The normal transistor current flow shift due to ambient temperature is in a direction opposite to that caused by the shift due to electrolyte temperature change.

Figure 3:
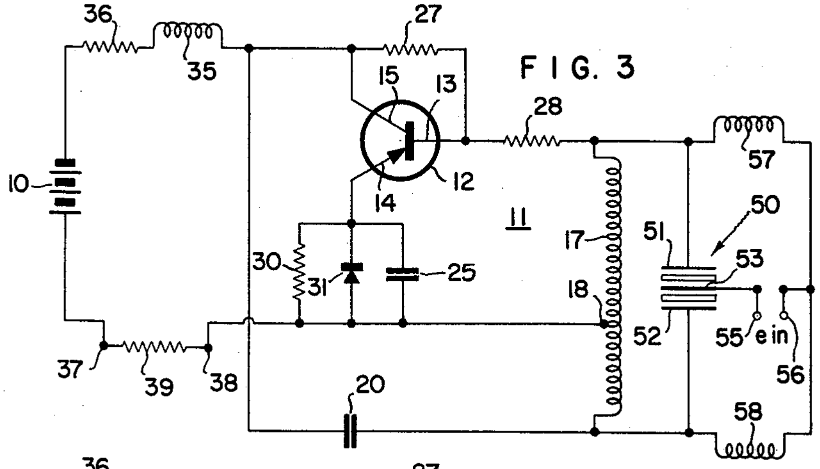
Fig. 3 shows a modified form of transistor oscillator circuit in a transducer configuration with the oscillator circuit output being regulated by a capacitive reactance whose reactance is variable in accordance with the magnitude of a direct current potential applied thereto.

*Figure 3*

The electrical circuit of Fig. 3 is basically the same as that of Fig. 1 in its overall operating characteristics. The principal difference in the present circuit lies in the manner in which the resonant circuit of the oscillator is tuned in order to produce current variations in the output. This is accomplished in the present form by the use of a direct current potential sensitive reactance 50 in the form of a condenser having end plates 51 and 52 with a center plate 53. The dielectric of the condenser 50 is formed of barium titanate which exhibits a change in its dielectric constant when there is a potential applied thereacross. A pair of input terminals 55 and 56 are adapted for connection to any suitable direct current potential source, which requires a high impedance input. A potential source whose voltage magnitude is in the range of 0–50 v. or higher has been used to give the desired capacity changes. Other dielectric materials require different voltage ranges. Such a voltage may be derived, for example, from an electrometer where high voltages are present and no current drain is desired. Input terminal 55 is connected directly to the plate 53 while the input terminal 56 is connected to the end plates 51 and 52 by way of choke coils 57 and 58 respectively.

In operation, the circuit operates substantially the same as that of Fig. 1, insofar as the alternating current paths are concerned and the direct current biasing paths are concerned. The only operational change is due to the presence of the variable capacitor 50 whose output capacity will change the resonant frequency of the circuit formed by the inductance element 17 and the condenser 50. As the capacity of the condenser 50 increases, the resonant frequency of the regenerative feedback circuit is changed so that there will be an increase in the output current flowing through the load impedance 39. If the capacity of the condenser 50 decreases, there will be a decrease in the output current flowing through the load impedance 39.

As barium titanate has a negative dielectric response, an increase in potential across the barium titanate will cause the capacity of the condenser 50 to decrease. Thus, an increase in the potential on the input terminals 55 and 56 will produce a proportional decrease in the output current flowing through the load impedance 39. The choke coils 57 and 58 serve as high impedance elements for the alternating current signal that appears across the resonant tank circuit formed by the inductance element 17 and the condenser 50. These choke coils isolate the input circuit terminals 55 and 56 from the alternating current and prevent the input circuit from loading down the resonant tank circuit so as to make the circuit inoperative.

Figure 4:
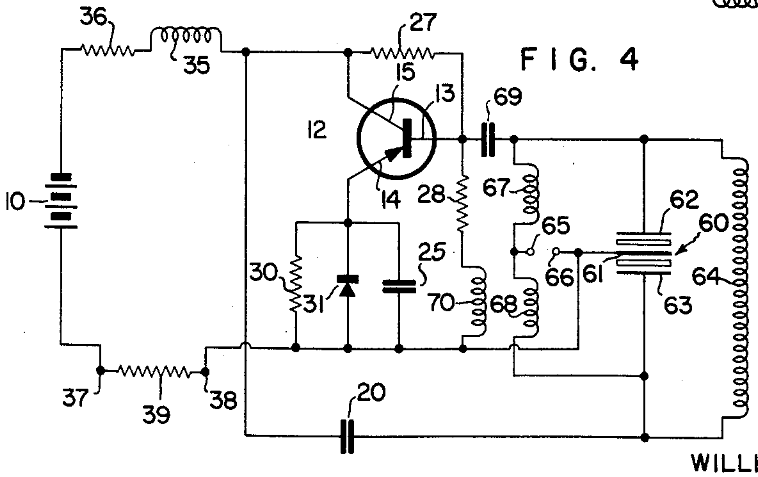
Fig. 4 shows a further modification of Fig. 3.

*Figure 4*

The electrical circuit of Fig. 4 is basically the same as that of Fig. 3 with the exception that the reactive elements in the regenerative resonant feedback circuit have been reversed in their position in the electrical circuit. In this circuit arrangement, there is provided a condenser 60 which serves as a tapped reactance element in the circuit and comprises a center plate 61 and a pair of end plates 62 and 63. The condenser 60 is connected in parallel with an inductive element 64.

The reactance of the condenser 60 is adapted to be varied by a direct current potential which is applied to input terminals 65 and 66. The terminal 66 is connected directly to the plate 61 while the terminal 65 is connected to the end plates 62 and 63 through choke coil 67 and 68 respectively. The plate 62 is coupled to the base 13 by a condenser 69. The resistor 28 and a choke 70 provide the D.C. bias circuit in this configuration.

Because of the reversal of the reactive elements in the resonant circuit, it is necessary to trace new biasing circuits for the transistor 12. The biasing circuit for the base 13 and emitter 14 may now be traced from the base 13 through resistor 28, choke 70, and resistor 30 or diode 31 to the emitter 14. The effect of the biasing circuit will be the same as before to provide the desired stable operation over wide ambient temperature changes.

The alternating signal circuit for the oscillator may be traced in a new circuit through condenser 60, i.e., from the collector 15 through condenser 20, condenser 60 between the end plate 63 and center plate 61, and condenser 25 to the emitter 14. The alternating current feedback signal to the base electrode 13 will be the signal drop across the upper portion of the condenser 60 between the center plate 61 and end plate 62.

When the direct current potential on the leads 65 and 66 is increased, the capacity of the condenser 60 will go down and there will be an accompanying decrease in the output current flowing through the load impedance 39. Conversely, if there is a decrease in the potential applied across the condenser plates of the condenser 60, there will be an increase in the output current flowing through the load impedance 39.

As with Fig. 3, the choke coils 67 and 68 serve to isolate the direct current input terminals 65 and 66 from the resonant circuit and prevent the direct current input circuit from loading down the oscillator input circuit to adversely affect the operation of the oscillator.

*Summary*

It will be readily apparent from the foregoing that there has been provided a new and improved transducer circuit which is adapted for use in converting an input signal into a proportional output direct current signal by the use of a transistor oscillator stabilized for temperature variations. In addition, the foregoing circuits have each been provided with special biasing means which will effectively extend the useful range of operation of the transducer at its minimum and maximum current output levels. Further, the transducer has been shown in the form of a circuit incorporating a condenser whose reactance is adapted to be varied in accordance with the magnitude of an applied potential.

While, in accordance with the provisions of the statutes, there has been illustrated and described the best forms of the embodiments of the invention known, it will be apparent to those skilled in the art that changes may be made in the forms of the invention disclosed without departing from the spirit of the invention as set forth in the appended claims and that in some cases certain features of the invention may be used to advantage without a corresponding use of other features.

Having now described the invention, what is claimed as new and for which it is desired to secure Letters Patent is:

1. In an electrical signal transducer, the combination comprising, a transistor having a base, an emitter, and a collector, an input circuit connected to said base and emitter, an output circuit connected to said emitter and said collector, a regenerative oscillatory producing feedback circuit connected between said output circuit and said input circuit, a direct current bypass circuit connected to shunt said base and said collector, a biasing resistor connected in series with said base, a second biasing resistor connected in a series circuit between said base and said emitter, a variable resistance diode connected in said series circuit in parallel with said second resistor, and means connecting said second resistor in series with said output circuit.

2. Apparatus as defined in claim 1 wherein said diode has a condenser connected in parallel therewith to bypass alternating current flowing in said output and said input circuit.

3. In the oscillator circuit of an electrical transducer, the combination comprising, a transistor device having a base electrode, an emitter electrode, and a collector electrode, a direct current power source connected to supply power to the emitter-collector circuit of said transistor device, first direct current biasing means for producing a bias between said base and emitter comprising a first resistor connected in shunt between said collector and base and a second resistor connected in series between said base and emitter, a second biasing means connected in series with said second resistor and in series with the emitter-collector path, a diode connected in parallel therewith, and a regenerative resonant feedback circuit coupling the output collector-emitter path of said transistor device to the input of said transistor device at said base and said emitter.

4. Apparatus as defined in claim 3 wherein said resonant circuit comprises a tapped reactive element connected in parallel with a second reactive element of opposite type.

5. Apparatus as defined in claim 4 wherein said tapped reactive element comprises an inductor with the tap thereof coupled to the emitter of said transistor device through a condenser connected in parallel with said diode.

6. Apparatus as defined in claim 4 wherein said tapped reactive element comprises a condenser whose impedance is adapted to be varied in accordance with the magnitude of a direct current potential applied across the plates thereof.

7. An electrical transducer comprising a transistor oscillator whose output current varies proportionally with changes in an input impedance, said oscillator comprising a transistor device having a base electrode, an emitter electrode, and collector electrode, a regenerative resonant circuit coupling the emitter-collector output circuit of said transistor device to the base-emitter input circuit of said transistor device, a direct current power source for said transistor connected in a series circuit to the collector-emitter path of said transistor device, an emitter biasing source comprising a resistor and a diode connected in parallel with each other and in series with said emitter, and a direct current connection from one end of said diode opposite the connection to said emitter to the base of said transistor device.

8. Apparatus as defined in claim 7 wherein said resistor in parallel with said diode comprises two resistors connected in series, one of which has an impedance which varies in accordance with the ambient temperature.

References Cited in the file of this patent

UNITED STATES PATENTS

| | | |
|---|---|---|
| 2,473,556 | Wiley | June 21, 1949 |
| 2,495,634 | Hepp | Jan. 24, 1950 |
| 2,556,286 | Meacham | June 12, 1951 |
| 2,693,572 | Chase | Nov. 2, 1954 |
| 2,708,720 | Anderson | May 17, 1955 |
| 2,750,508 | Waldhauer | June 12, 1956 |
| 2,757,243 | Thomas | July 31, 1956 |
| 2,778,942 | Ehret et al. | Jan. 22, 1957 |
| 2,816,220 | Goodrich | Dec. 10, 1957 |